United States Patent [19]

Yokoyama

[11] 4,433,307

[45] Feb. 21, 1984

[54] POWER SUPPLY CHANGEOVER TYPE POWER AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 321,621

[22] Filed: Nov. 16, 1981

[51] Int. Cl.³ .............................................. H03F 3/20
[52] U.S. Cl. .................................... 330/297; 330/298
[58] Field of Search ............... 330/297, 298, 207 P

[56] References Cited

U.S. PATENT DOCUMENTS 4,339,730  7/1982  Yokoyama ........................ 330/297

Primary Examiner—James B. Mullins
Assistant Examiner—Gene Wan
Attorney, Agent, or Firm—Spensley, Horn, Jubas & Lubitz

[57] ABSTRACT

A power supply changeover type power amplifier arranged so that a voltage to be supplied to an output transistor is switched between a high voltage and a low voltage in accordance with the magnitude of an output signal level to thereby expand the dynamic range and improve the power efficiency of the amplifier, and also that the state in which the voltage is switched over to high voltage does not continue for an extended length of time to avoid an excessive consumption of power due to, for example, a high level burst-like signal applied to the power amplifier.

16 Claims, 3 Drawing Figures

POWER SUPPLY CHANGEOVER TYPE POWER AMPLIFIER

BACKGROUND OF THE INVENTION (a) Field of the invention

The present invention pertains to a power supply changeover type power amplifier for audio instruments, which is capable of materializing both an expansion of dynamic range and an improvement of power efficiency, without causing overload or other harms in the power supply unit and other constituting parts.

(b) Description of the prior art

For dynamic ranges in audio power amplifiers intended for hi-fi reproduction, there have been required enhanced values for faithful amplification of audio signals having wide dynamic range in amplitude such as music signals in which large amplitudes are occasionally contained in ordinary amplitudes. In case it is intended to obtain such wide dynamic ranges in the amplifiers, it is necessary to provide a power supply capable of outputting power supply voltages having large absolute values, i.e. high voltage power supply, in power amplifiers of said type, in order to faithfully amplify musical signals of such possible large amplitudes as mentioned above, i.e. in order not to cause clipping of the output signals. On the other hand, however, for a dynamic range sufficient to amplify musical signals having only ordinary amplitudes, it is better for a power amplifier of this type to be applied with a power supply designed for outputting power supply voltages having smaller absolute values, i.e. low voltage power supply, from the viewpoint that, for example, the collector dissipation of the constituent output transistor is reduced, and that the power efficiency is thus enhanced. And, moreover, in view of the fact that, musical signals which are amplified by an ordinary audio power amplifier very seldom contain trend of successive signals having large amplitudes especially recognized in classical music, it will be understood that, by arranging the overall audio system so that signals having ordinary amplitudes are to be amplified by being applied with the abovesaid low voltage power supply, and that only the signals having large amplitudes are to be amplified by being applied with the above-mentioned high voltage power supply, it is possible to materialize a power amplifier concurrently having the advantages of a substantially expanded dynamic range and a high power efficiency.

In case, however, it is intended to use a power amplifier provided with two kinds of power supplies, one of which outputs a high voltage and the other outputs a low voltage as stated above so that the power supply voltages are switched between high and low levels in response to the signal amplitudes, it will be noted that, in view of the abovesaid fact that ordinary musical signals only occasionally contain signals of large amplitudes, the high voltage power supply would suffice only if it is capable of operating intermittently within a dynamic range in which the high voltage power supply can respond normally to such large amplitude signals. However, in case the amplifier system is arranged so that the abovesaid two kinds of power supplies are switched over between high and low voltage levels in response only to the amplitudes alone of the applied input signals, it will be noted that, in case a series of signals having large amplitudes, i.e. for example, tone burst signals which can not be included in ordinary musical signals, and a few kinds of electronic musical signals, are applied in succession to the amplifier for some reason or other, the high voltage power supply alone will be operated in succession, causing a large power to be consumed for an extended length of time. This gives rise to the necessity for setting the power capacity of the high voltage power supply and of the transistors of the output stage large enough, and this would undesirably lead to a high cost of manufacture of the entire amplifier system.

SUMMARY OF THE INVENTION

It is, therefore, a first object of the present invention to provide a power supply changeover type power amplifier which is capable of materializing a wide dynamic range and a high power efficiency and which, nevertheless, is arranged so that no excessive power dissipation takes place under any condition.

A second object of the present invention is to provide a power amplifier of the type as mentioned above, which is arranged so that no large power capacity is required of a high voltage power supply which is one of power supplies that are to be switched over therebetween, nor of output transistors.

A third object of the present invention is to provide a power amplifier of the type as mentioned above, which is arranged so that said high voltage power supply is prevented from operating consecutively for an extended length of time.

A fourth object of the present invention is to provide a power amplifier of the type as mentioned above, which is arranged to be operative so that, upon the moment that the output level exceeds a predetermined level, the high voltage power supply is selected to be used during a predetermined length of time.

A fifth object of the present invention is to provide a power amplifier of the type as mentioned above, which is arranged so that, when the high voltage power supply has been selected in use, this power supply operates for said predetermined length of time, and that following this operation, however, the selection of this high voltage power supply is inhibited for another predetermined length of time.

DETAILED DESCRIPTION OF THE PREFERRED EMBODIMENT

Description will hereunder be made of the present invention in further detail with respect to an embodiment of the present invention by referring to the accompanying drawings.

Figure 1:
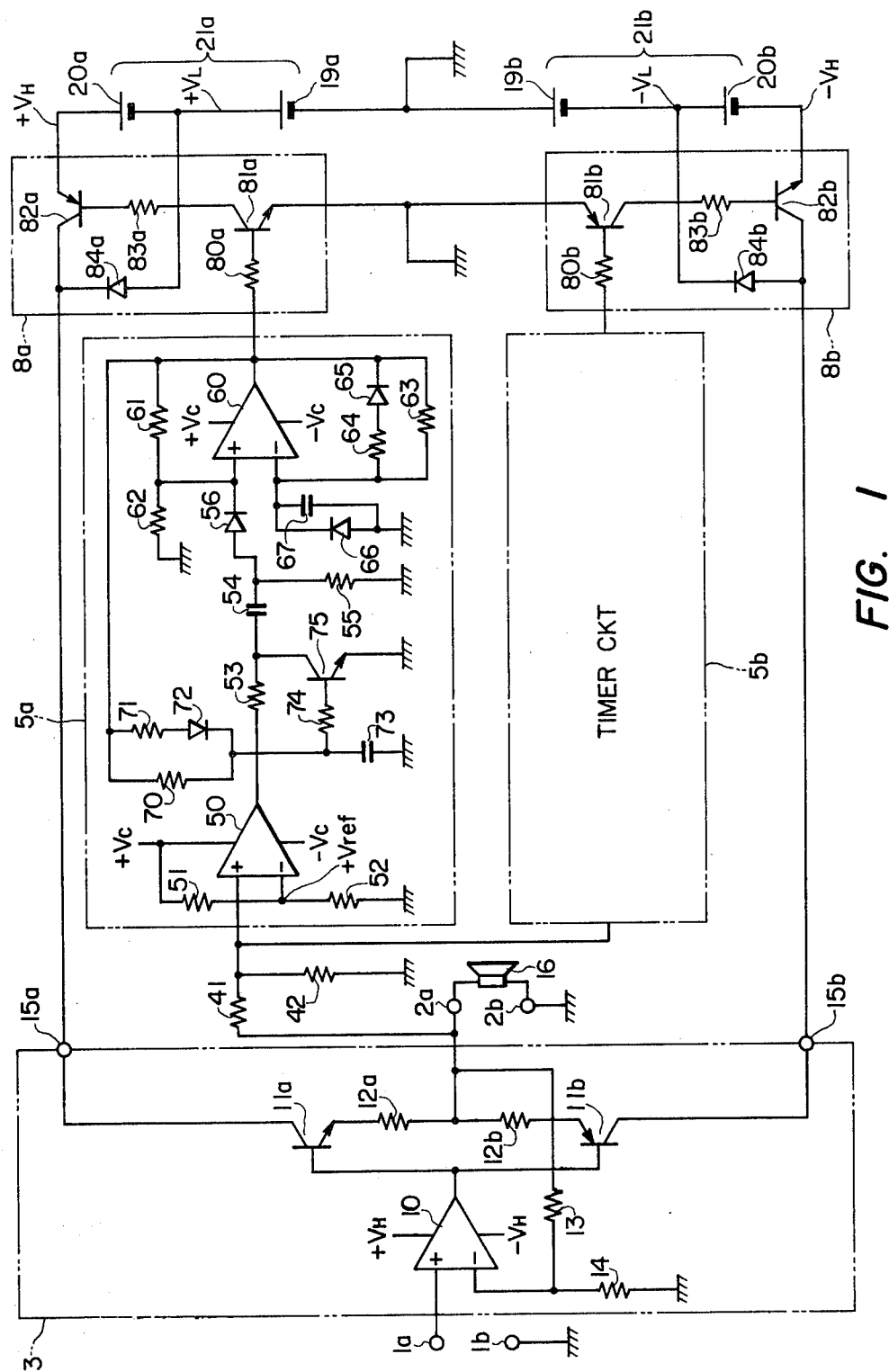
FIG. 1 is a circuit diagram showing the arrangement of an embodiment of the present invention.

FIG. 1 is a circuit diagram showing the arrangement of an embodiment of a power amplifier according to the present invention. In FIG. 1, reference numerals-symbols 1a and 1b represent input terminals; 2a and 2b output terminals; and 3 a power amplifier circuit assigned to amplify a signal inputted to said input terminals 1a and 1b and to supply their outputs to a loudspeaker 16 as a load connected between the output terminals 2a and 2b. Also, numeral-symbols 5a and 5b represent timer circuits which are energized, respectively, when an output level of the power amplifier circuit 3 exceeds a predetermined level. These timer circuits 5a and 5b are arranged so as to perform circuit operations, respectively, which are perfectly symmetrical relative to the ground potential. Also, numeral-symbols 8a and 8b represent changeover circuits which are controlled by said timer circuits 5a and 5b, respectively. 19a,19b, 20a, 20b represent power supplies. The changeover circuits 8a and 8b are arranged so that a required power supply voltage is supplied to the power amplifier circuit 3 from either the power supplies 19a and 20a or the power supplies 19b and 20b, based on the outputs of the timer circuits 5a and 5b, respectively.

Now, in the power amplifier circuit 3, reference numeral 10 represents an operational amplifier with positive and negative power supplies $V_H$ and $-V_H$; 11a and 11b an npn type transistor and a pnp type transistor, respectively; 12a and 12b are emitter resistors, respectively, of the transistors 11a and 11b; 13 and 14 feedback dividing resistors; and 15a and 15b are power supply terminals on the positive side and the negative side, respectively, for being applied with changed-over power supply voltages. These parts jointly constitute a known push-pull power amplifier circuit of the non-inverting type.

Resistors 41 and 42 are intended for the division of voltage such that the output voltage derived at the output terminal 2a of the power amplifier circuit 3 is divided by these resistors 41 and 42. The divided output voltage is suppled to a non-inverting input terminal of an operational amplifier 50 of the timer circuit 5a, and also to the timer circuit 5b having a symmetrical arrangement relative to said timer circuit 5a.

Next, in the timer circuit 5a, the operational amplifier 50 is driven by the positive side power supply $+V_c$ and the negative side power supply $-V_c$, and operates as a comparator. To its inverting input terminal is supplied a reference voltage $+V_{ref}$ on the positive side which is obtained by dividing the positive side power supply voltage $+V_c$ by voltage-dividing resistors 51 and 52. In this instance, the reference voltage $+V_{ref}$ is set at a value a little lower than the voltage which is derived at the connecting point of said resistors 41 and 42 when the power amplifier circuit 3 outputs its highest level of voltage which can be outputted thereby by the use of a power supply voltage $+V_L$ which will be described later. In case a voltage lower than said reference voltage $+V_{ref}$ is supplied to the non-inverting input terminal of said operational amplifier 50, there is outputted a negative voltage which is approximately $-V_c$ at the output terminal thereof, whereas when a voltage exceeding the reference voltage $+V_{ref}$ is supplied to the noninverting input terminal thereof, there is outputted a positive voltage which is approximately $+V_c$ at the output terminal thereof. The output signal of this operational amplifier 50 is supplied via a resistor 53 to a differentiation circuit which is constituted by a capacitor 54 and a resistor 55, and is differentiated thereby. Among the resulting differentiated signals, only the positive pulse signal is supplied via a diode 56 to the non-inverting input terminal of an operational amplifier 60. More particularly, only when the output of the operational amplifier 50 has shifted from a negative voltage (approximately $-V_c$) to a positive voltage (approximately $+V_c$), a positive pulse signal is supplied to the non-inverting input terminal of the operational amplifier 60.

The abovesaid operational amplifier 60 is intended for use as a monostable multivibrator. This monostable multivibrator is comprised of: said operational amplifier 60 with positive and negative power supplies $+V_c$ and $-V_c$; a resistor 61 inserted between an output terminal and the non-inverting input terminal of this operational amplifier 60; a resistor 62 inserted between said non-inverting input terminal and the ground; a resistor 63 inserted between the output terminal and an inverting input terminal of said operational amplifier 60; a series connection of a resistor 64 and a diode 65 which is inserted across the opposite ends of said resistor 63; and a parallel connection of a diode 66 and a capacitor 67 which is inserted between the inverting input terminal of the operational amplifier 60 and the ground. In this instance, the monostable multivibrator operates in the manner as will be described below. Firstly, in the normal state, the voltage at the output terminal of the operational amplifier 60 is at a negative potential approximately $-V_c$. However, when a positive pulse signal is supplied to its non-inverting input terminal, the voltage at the output terminal of said operational amplifier 60 will rise up to about $+V_c$. This positive voltage is divided by the resistors 61 and 62, and is positively fed back to the non-inverting input terminal to maintain the voltage at said noninverting input terminal at said divided voltage. On the other hand, the aforesaid positive voltage (approximately $+V_c$) which is outputted by the operational amplifier 60 charges up the capacitor 67 via the resistor 63. Therefore, the voltage at the inverting input terminal thereof will rise in accordance with the time constant which is determined by the resistance value of the resistor 63 and the capacitance value of the capacitor 67. And, when there is established an agreement between the voltage at the non-inverting input terminal and the voltage at the inverting input terminal of said operational amplifier 60, the voltage at the output terminal thereof drops, and accordingly the resulting positive charge on the capacitor 67 is quickly discharged, via the resistor 64 (having a resistance value $<<$ the resistance value of the resistor 63) and a diode 65, until the potential at said inverting input terminal is rendered to the ground potential. As a result, the output voltage of the operational amplifier 60 is rendered to the negative potential (about $-V_c$), and thus the one cycle action of the monostable multivibrator completes. That is, the output terminal of this operational amplifier 60 normally is at the negative potential (approximately $-V_c$), and this operational amplifier 60 outputs from said output terminal a positive voltage (approximately $+V_c$) only for a certain length of time which is herein designated as $T_1$ and which is determined by the values of the resistor 63 and the capacitor 67, from the time at which a positive pulse signal was inputted to the non-inverting input terminal of the operational amplifier 60. The signal which is derived at the output terminal of this operational amplifier 60 is supplied to the connecting point of a resistor 70 and a resistor 71, and to one end of a resistor 80a in the changeover circuit 8a which will be described later in detail.

Next, said resistor 70, a series connection of the resistor 71 (having a resistance value $<<$ a resistance value of the resistor 70) and a diode 72 inserted across the opposite ends of the resistors 70 and 71, a capacitor 73 inserted between the connecting point of the resistor 70 and the cathode of the diode 72 and the ground; a transistor (in this instance, it is an npn type transistor) 75 whose collector is coupled to the connecting point of said resistor 53 and said capacitor 54 and whose emitter is grounded; and a resistor 74 inserted between the base of this transistor 75 and that terminal located on the non-grounded side of said capacitor 73, jointly constitute an output-inhibiting gating circuit of said operational amplifier 50. Among these constituent parts, the resistors 70 and 71, the diode 72, and the capacitor 73, jointly constitute an integration circuit. The charge-up time constant of this integration circuit which is determined by the values of the capacitor 73 and the resistor 71 is set smaller than the discharge time constant thereof which is determined by the values of the capacitor 73 and the resistor 70.

The operation of this output-inhibiting gate circuit is as follows. In the normal state, the transistor 75 is in its non-conducting state. However, when the operational amplifier 60 outputs a positive voltage, the capacitor 73 is quickly charged up positive via the resistor 71 and the diode 72 by virtue of the positive voltage outputted from the operational amplifier 60. Whereby, there is supplied via the resistor 74 a base current of the transistor 75 due to said charged-up positive voltage, causing the transistor 75 to be rendered conductive. As a result, the connecting point of the resistor 53 and the capacitor 54 is connected to the ground. While, when the output voltage of the operational amplifier 60 is rendered to the negative potential, the positive charge stored in the capacitor 73 is discharged through the resistor 70, and concurrently it is discharged via the resistor 74 as a base current of the transistor 75. Upon lapse of a certain length of time which is designated as $T_2$ and which is determined by the values of the capacitor 73 and resistors 70 and 74, the base current of the transistor 75 becomes almost nil, and as a result this transistor 75 is rendered non-conductive. That is, the transistor 75 holds its conducting state only for the length of time $(T_1+T_2=T)$ which is the sum of the length of time $T_1$ throughout which the operational amplifier 60 is outputting a positive voltage, plus a certain length of time $T_2$ starting at the moment at which the output of the operational amplifier 60 has shifted from a positive voltage to the negative potential. And, for this summed-up length of time T, the output of the operational amplifier 50 is inhibited of its being supplied to the operational amplifier 60.

Next, in the changeover circuit 8a, when the output of the operational amplifier 60 in said timer circuit 5a becomes a positive voltage (approximately $+V_c$), a base current is supplied to a transistor (npn type transistor) 81a via the resistor 80a, and accordingly this transistor 81a is rendered conductive, and when the output of said operational amplifier 60 assumes the negative voltage (approximately $-V_c$), the transistor 81a is rendered non-conductive. Also, when the transistor 81a is rendered conductive, a base current of a transistor (pnp type transistor) 82a is allowed to flow thereto via a resistor 83a, so that this transistor 82a is rendered conductive, and when the transistor 81a is rendered non-conductive, the transistor 82a is rendered non-conductive. Also, reference numeral-symbol 84a represents a diode of a large current capacity.

The operation of this changeover circuit 8a is as follows. In case the output of the operational amplifier 60 of the timer circuit 5a is at the negative voltage, both the transistors 81a and 82a are in their non-conductive state. Accordingly, the changeover circuit 8a supplies, to the power supply terminal 15a of the power amplifier circuit 3 via the diode 84a, a power supply voltage $+V_L$ which is generated by the power supply 19a. Also, when the output of the operational amplifier 60 assumes a positive voltage, both the transistors 81a and 82a are rendered conductive, and accordingly the changeover circuit 8a supplies, to the power supply terminal 15a via the transistor 82a, a power supply voltage $+V_H$ ($>+V_L$) which is generated by the power supply 19a and the power supply 20a, i.e. by a power supply 21a.

It should be understood here that, in the changeover circuit 8b, a transistor (pnp type transistor) 81b, a transistor (npn type transistor) 82b, resistors 80b and 83b, and a diode 84b are so arranged that they perform an operation which is completely symmetrical relative to the ground potential and also to the action of the changeover circuit 8a described above. And, when an output of the timer circuit 5b is at a positive voltage, the transistors 81b and 82b of the changeover circuit 8b are rendered non-conductive, so that this changeover circuit 8b supplies, to the power supply terminal 15b of the power amplifier circuit 3 via the diode 84b, a power supply voltage $-V_L$ which is generated by the power supply 19b. Also, when the output of the timer circuit 5b assumes a negative voltage, the transistors 81b and 82b of the changeover circuit 8b are rendered conductive, so that this changeover circuit 8b supplies, to said power supply terminal 15b via the transistor 82b, a power supply voltage $-V_H$ ($|V_H|>|V_L|$) which is generated by the power supply 19b and the power supply 20b, i.e. by a power supply 21b.

Figure 2:
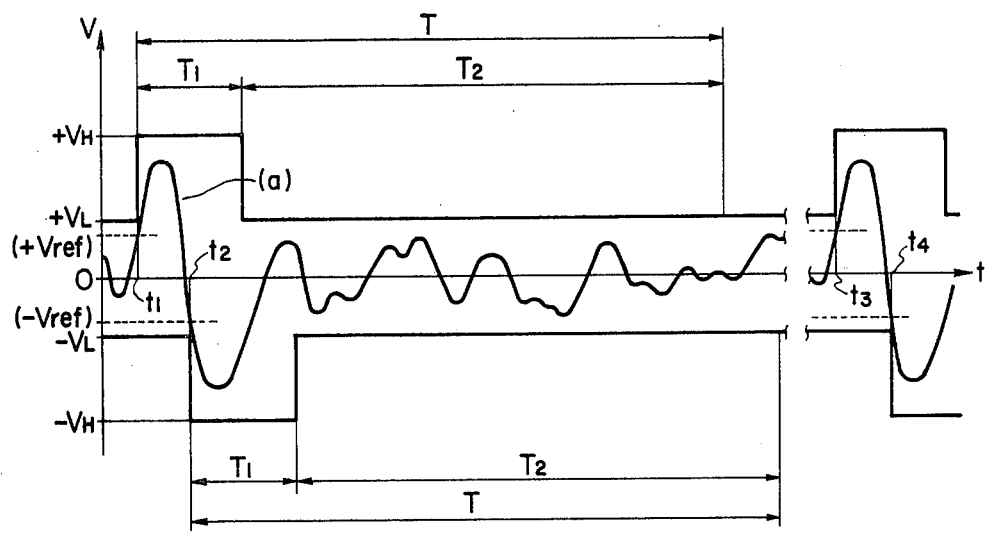
FIGS. 2 and 3 are waveshape illustrations for explaining the operation of said embodiment.
Figure 3:
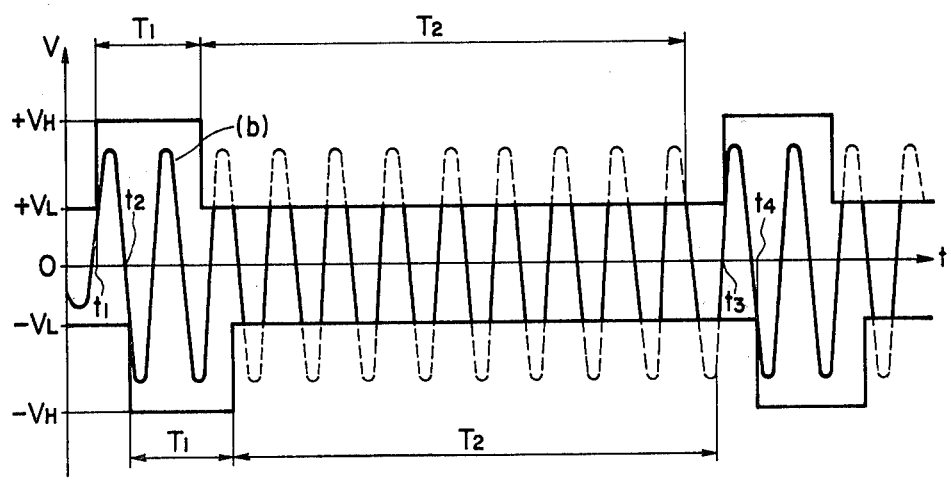

The operation of this embodiment having the above-said arrangement will hereunder be described in further detail by referring to FIGS. 2 and 3. In the following description, a stress is placed on the explanation of the circuit arrangement on the positive voltage side in this embodiment.

FIG. 2 is a waveshape chart showing the relationship between the variation of the output voltage of the power amplifier circuit 3 and the variation of the power supply voltage of this power amplifier circuit in the instance when an ordinary musical signal having a waveshape (a) is amplified.

Here, in the instance wherein a musical signal having an ordinary amplitude is being supplied across the input terminals 1a and 1b in FIG. 1, and wherein, as a result, the voltage at the connecting point of the resistors 41 and 42 is lower than the reference voltage $+V_{ref}$, the output voltage of the operational amplifier 50 is constant, being approximately $-V_c$. As a result, the output of the operational amplifier 60 is at the negative voltage, and the changeover circuit 8a is supplying a power supply voltage $+V_L$ to the power supply terminal 15a of the power amplifier circuit 3. Similarly, a power supply voltage $-V_L$ is being supplied to the power supply terminal 15b by the timer circuit 5b and the changeover circuit 8b.

Now, if, at time $t_1$, the amplitude of this musical signal becomes a signal of a large amplitude exceeding an ordinary amplitude level, and if, as a result, the voltage at the connecting point of the resistors 41 and 42 exceeds the reference voltage $+V_{ref}$, the output voltage of the operational amplifier 50 rises up to approximately a potential of $+V_c$, and accordingly the timer circuit 5a is activated. And, the output voltage of the operational amplifier 60 will output a positive voltage (approximately $+V_c$) throughout the period of time $T_1$ from said time $t_1$. As a result, a power supply voltage $+V_H$ is supplied to the power supply terminal 15a for the length of time $T_1$ from time $t_1$. Accordingly, said large amplitude signal is amplified and outputted throughout this period of time $T_1$ without being clipped. Upon lapse of this period of time $T_1$, the power supply voltage at the power supply terminal 15a is again lowered to $+V_L$. Also, throughout the period $T_1+T_2$ from time $t_1$, i.e. till the lapse of time T, the transistor 75 is continuously rendered conductive. Even when a large amplitude signal is supplied again to said power amplifier circuit 3 during said period of time $T_2$, the timer circuit 5a will never again be activated. Also, in a similar manner, at time $t_2$, the timer circuit 5b is activated. And, a power supply voltage $-V_H$ is supplied to the power supply terminal 15b for a length of time $T_1$ from said time $t_2$. Upon lapse of this time length $T_1$, a power supply voltage $-V_L$ will become supplied to the power supply terminal 15b.

And, in case a large amplitude musical signal is again supplied after the lapse of time length T from time $t_1$ and time $t_2$, respectively, the power supply voltage is again changed over at time $t_3$ and time $t_4$ in FIG. 2 in a manner similar to that described above.

Next, let us suppose that, in this embodiment, a tone burst signal having a waveshape (b) shown in FIG. 3 is supplied to the power amplifier 3 for any reason. For a time length $T_1$ from time $t_1$ at which this burst signal began to be supplied, and for a time length $T_1$ from time $t_2$, the power supply voltages $+V_H$ and $-V_H$ are supplied to the power supply terminals 15a and 15b, respectively. However, for the time length $T_2$ following these respective lengths of time $T_1$, the power supply voltages $+V_L$ and $-V_L$ will be supplied, respectively. As described above, even in the above-stated condition, there never occurs the instance that the power supply voltages $+V_H$ and $-V_H$ are supplied continuously. Accordingly, the power supplies 20a and 20b, the transistors 11a and 11b and other parts will never consume a large power continuously for an extended length of time.

In the above-stated embodiment, when consideration is given to the actual state of occurrence of large-amplitude signals which are contained in ordinary musical signals, no problem will come to fore in practice, if the time length $T_1$ is set at 20 msec and the time length $T_2$ is set at 200 msec. In such instance, even when such large amplitude signals as tone burst signals are inputted, the power supplies 20a and 20b will consume only about one tenth (1/10) of the power consumed when these power supplies are supplied continuously. Also, the collector dissipation of transistors 11a and 11b will be reduced in accordance with the ratio between time lengths $T_1$ and $T_2$ as compared with the instance wherein these transistors are driven continuously by power supply voltages $+V_H$ and $-V_H$, respectively.

What is claimed is:

1. A power supply changeover type power amplifier, comprising:
   amplifying circuit means for amplifying an input signal;
   timer means activated, upon receipt of an output signal delivered from said amplifying circuit means, only for a predetermined first length of time whenever said output signal exceeds a predetermined level, and inhibited of its re-activation for a predetermined second length of time following the lapse of said predetermined first length of time;
   power supply means provided with a high voltage power supply and a low voltage power supply to be selectively supplied to said amplifying circuit means; and
   changeover means for changing over the connection of said high voltage power supply and said low voltage power supply of said power supply means to said amplifying circuit means upon receipt of an output signal delivered from said timer means.

2. A power supply changeover type power amplifier, according to claim 1, wherein said timer means comprises:
   detecting means for comparing the level of said output signal delivered from said amplifying circuit means with a reference level to detect the magnitude of said output signal, and for outputting a detection signal representing the result of the detection;
   output circuit means for being activated for said predetermined first length of time when said detection signal from said detecting means represents that said output signal of said amplifying circuit means exceeds said predetermined level; and
   inhibiting means for being actuated for said predetermined second length of time following the completion of activation of said output circuit means to inhibit a re-activation of said output circuit means.

3. A power supply changeover type power amplifier, according to claim 2, wherein:
   said reference level in said detecting means is one corresponding to a level slightly lower than a voltage level of said low voltage power supply.

4. A power supply changeover type power amplifier, according to claim 2, wherein:
   said detecting means is a comparator comprised of an operational amplifier.

5. A power supply changeover type power amplifier, according to claim 2, wherein:
   said output circuit means is a monostable multiple vibrator comprised of an operational amplifier.

6. A power supply changeover type power amplifier, according to claim 5, further comprising:
   differentiation circuit means connected to an input side of said output circuit means to differentiate a detection signal delivered from said detecting means and to transmit the result of the differentiation to said output circuit means.

7. A power supply changeover type power amplifier, according to claim 2, wherein:
   said inhibiting means shuts off the electrical path between said detecting means and said output circuit means only for said predetermined second length of time, following completion of an action of said output circuit means.

8. A power supply changeover type power amplifier, according to claim 7, wherein:
   said inhibiting means drops the level of an output signal of said detecting means to the ground potential only for said predetermined second length of time, following completion of an action of said output circuit means.

9. A power supply changeover type power amplifier, according to claim 8, wherein: said inhibiting means comprises:
   integration circuit means for integrating an output signal during an activation of said output circuit means; and
   a switching device connected between said detecting means and said ground for being activated upon receipt of an output from said integration circuit means.

10. A power supply changeover type power amplifier, according to claim 9, wherein:
said integration circuit means has a charge-up time constant and a discharge time constant which are different from each other.

11. A power supply changeover type power amplifier, according to claim 10, wherein:
said charge-up time constant of said integration circuit means is smaller than said discharge time constant.

12. A power supply changeover type power amplifier, according to claim 1, wherein: said changeover means comprises:
a switching device for effecting change-over a voltage to be supplied to said amplifying circuit means between high voltage power supply and low voltage power supply.

13. A power supply changeover type power amplifier, according to claim 1, wherein:
said amplifying circuit means constitutes a balanced power supply type SEPP circuit; and
said power supply means is provided with a high voltage power supply and a low voltage power supply on the positive side, and a high voltage power supply and a low voltage power supply on the negative side;
said changeover means is provided separately for each of the positive side and the negative side so as to be operative that the changeover means provided on the positive side performs changeover between the high and low voltage power supplies on the positive side, and that the changeover means provided on the negative side performs changeover between the high and low voltage power supplies on the negative side; and
said timer means is provided separately for each of the positive side and the negative side so as to perform controlling of the respective changeover actions of the changeover means on the positive side and the negative side.

14. A power amplifier comprising:
an amplifying circuit for amplifying an input signal;
a low voltage power supply;
a high voltage power supply;
switching means for selectively connecting the low voltage supply or the high voltage supply to supply the amplifying circuit; and
control means for controlling the switching means, said control means operating to cause the connection to the amplifying circuit to be switched from the low voltage supply to the high voltage supply when the input signal exceeds a predetermined level, said control means causing the high voltage supply to remain connected to the amplifying circuit for a predetermined first time period and causing the connection to the amplifying circuit to be switched back to the low voltage supply at the end of the first time period and maintained for a second predetermined time period regardless of the level of the input signal.

15. In a power amplifier of the type including an amplifying circuit which is selectively supplied by a low voltage power supply and a high voltage power supply in accordance with the level of an input signal to be amplified, the improvement comprising switching control means for causing the supply to the amplifying circuit to be switched from the low voltage supply to the high voltage supply for a predetermined first time period when the input signal exceeds a predetermined level and then causing the supply to the amplifying to be switched back to the low voltage supply and inhibiting subsequent switching to the high voltage supply for a predetermined second time period regardless of the level of the input signal.

16. In a power amplifier of the type which includes an amplifying circuit for amplifying an input signal, a low voltage power supply which is supplied to the amplifying circuit when the input signal is relatively low and a high voltage power supply which is supplied to the amplifying circuit when the input signal is relatively high, the improvement wherein the amplifier includes switching control means for switching the connection to the amplifying circuit from the low voltage power supply to the high voltage power supply for a predetermined first time period and thereafter switching the connection to the amplifying circuit back to the low voltage supply for a predetermined second time period during which additional switching to the high voltage power supply is inhibited.

* * * * *

UNITED STATES PATENT AND TRADEMARK OFFICE
CERTIFICATE OF CORRECTION

PATENT NO. : 4,433,307
DATED : Feb. 21, 1984
INVENTOR(S) : Kenji Yokoyama

It is certified that error appears in the above-identified patent and that said Letters Patent are hereby corrected as shown below:

On the title page insert:

-- [30]  Foreign Application Priority Data

Nov. 28, 1980 [JP] Japan ......... 55-167709.  --

*Signed and Sealed this*

*Eighteenth* Day of *December 1984*

[SEAL]

Attest:

GERALD J. MOSSINGHOFF

*Attesting Officer*  *Commissioner of Patents and Trademarks*